United States Patent
Jones et al.

(10) Patent No.: US 10,611,666 B2
(45) Date of Patent: Apr. 7, 2020

(54) CONTROLLED CRYSTALLIZATION OF GLASS CERAMICS FOR ELECTRONIC DEVICES

(71) Applicant: Apple Inc., Cupertino, CA (US)

(72) Inventors: Christopher D. Jones, Los Altos, CA (US); Dale N. Memering, Langhorne, PA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/007,851

(22) Filed: Jun. 13, 2018

(65) Prior Publication Data
US 2019/0169061 A1 Jun. 6, 2019

Related U.S. Application Data

(60) Provisional application No. 62/593,699, filed on Dec. 1, 2017.

(51) Int. Cl.
*C03B 23/03* (2006.01)
*C03B 32/02* (2006.01)
(Continued)

(52) U.S. Cl.
CPC .............. *C03B 32/02* (2013.01); *C03B 23/02* (2013.01); *C03B 23/0302* (2013.01);
(Continued)

(58) Field of Classification Search
CPC ..... C03B 23/02; C03B 23/03; C03B 23/0302; C03B 23/0307; C03B 32/02; H04M 1/02; H05K 5/0017; H05K 5/00; H05K 5/03
(Continued)

(56) References Cited

U.S. PATENT DOCUMENTS

| 2,795,084 A | 6/1957 | Littleton |
| 3,410,673 A | 11/1968 | Marusak |

(Continued)

FOREIGN PATENT DOCUMENTS

| DE | 102016107630 | 10/2017 |
| WO | WO2012/027660 | 3/2012 |

(Continued)

OTHER PUBLICATIONS

Moriceau et al., "Overview of recent direct wafer bonding advances and applications," Advances in Natural Sciences: Nanoscience and Nanotechnology, vol. 1, No. 043004, 11 pages, 2010.

*Primary Examiner* — Timothy J Thompson
*Assistant Examiner* — Guillermo J Egoavil
(74) *Attorney, Agent, or Firm* — Brownstein Hyatt Farber Schreck, LLP

(57) ABSTRACT

Methods are disclosed directed to a controlled crystallization (ceramic particle growth) of a shaped glass ceramic workpiece. The physical and chemical properties of the shaped glass ceramic of the present invention may be specified or tailored by shaping or machining the workpiece during or in combination with a controlled crystallization process that nucleates (precipitates) ceramic particles from a glass material. For example, in one embodiment, a non-crystalline amorphous solid may be heated above a transition temperature and shaped (e.g., molded, pressed, or the like). Ceramic particles may be precipitated within the solid during at least one of the heating or the shaping, thereby forming a shaped glass ceramic.

20 Claims, 14 Drawing Sheets

(51) Int. Cl.
  *H05K 5/00* (2006.01)
  *H05K 5/03* (2006.01)
  *H04M 1/02* (2006.01)
  *C03B 23/02* (2006.01)

(52) U.S. Cl.
  CPC ......... *C03B 23/0307* (2013.01); *H04M 1/02* (2013.01); *H05K 5/0017* (2013.01); *H05K 5/03* (2013.01)

(58) Field of Classification Search
  USPC ...................................................... 174/390
  See application file for complete search history.

(56) References Cited

U.S. PATENT DOCUMENTS

| | | | |
|---|---|---|---|
| 3,433,611 A | 3/1969 | Kubican | |
| 3,464,880 A | 9/1969 | Rinehart | |
| 3,737,294 A | 6/1973 | Dumbaugh, Jr. et al. | |
| 3,746,526 A | 7/1973 | Giffon | |
| 3,899,315 A | 8/1975 | Siegmund | |
| 7,240,519 B2 | 7/2007 | Schwartz et al. | |
| 7,459,199 B2 | 12/2008 | Skeen | |
| 7,497,093 B2 | 3/2009 | Rosenflanz | |
| 8,003,217 B2 | 8/2011 | Rosenflanz | |
| 8,092,737 B2 | 1/2012 | Chang et al. | |
| 8,277,704 B2 | 10/2012 | Matsushima et al. | |
| 8,379,159 B2 | 2/2013 | Hsu | |
| 8,783,065 B2 | 7/2014 | Schillert et al. | |
| 8,840,997 B2 | 9/2014 | Koyama et al. | |
| 8,898,824 B2 | 12/2014 | Neidich et al. | |
| 9,125,298 B2 | 9/2015 | Russell-Clarke | |
| 9,134,547 B2 | 9/2015 | McCabe et al. | |
| 9,140,522 B1 | 9/2015 | Miller et al. | |
| 9,193,625 B2 | 11/2015 | Bookbinder et al. | |
| 9,242,889 B2 | 1/2016 | Yamakaji et al. | |
| 9,249,045 B2 | 2/2016 | Gabel et al. | |
| 9,302,937 B2 | 4/2016 | Gulati et al. | |
| 9,321,677 B2 | 4/2016 | Chang et al. | |
| 9,359,251 B2 | 6/2016 | Bookbinder et al. | |
| 9,375,900 B2 | 6/2016 | Tsuchiya et al. | |
| 9,516,149 B2 | 12/2016 | Wright et al. | |
| 9,522,836 B2 | 12/2016 | Gulati et al. | |
| 9,674,322 B2 | 6/2017 | Motohashi et al. | |
| 9,718,727 B2 | 8/2017 | Bookbinder et al. | |
| 9,840,435 B2 | 12/2017 | Ohara et al. | |
| 9,897,574 B2 | 2/2018 | Roussev et al. | |
| 9,902,138 B2 | 2/2018 | Edwards | |
| 9,902,641 B2 | 2/2018 | Hall et al. | |
| 9,946,302 B2 | 4/2018 | Franklin et al. | |
| 10,189,228 B2 | 1/2019 | Couillard et al. | |
| 10,286,631 B2 | 5/2019 | Alder et al. | |
| 10,357,945 B2 | 7/2019 | Beall et al. | |
| 2008/0295948 A1* | 12/2008 | Yokoyama | B32B 18/00 156/89.11 |
| 2009/0189489 A1* | 7/2009 | Yura | C01G 23/003 310/358 |
| 2010/0285310 A1 | 11/2010 | Izutani et al. | |
| 2011/0041987 A1* | 2/2011 | Hori | H01L 21/6836 156/153 |
| 2012/0052271 A1 | 3/2012 | Gomez et al. | |
| 2012/0236526 A1 | 9/2012 | Weber | |
| 2015/0030834 A1 | 1/2015 | Morey et al. | |
| 2015/0104618 A1 | 4/2015 | Hayashi et al. | |
| 2015/0122406 A1 | 5/2015 | Fisher et al. | |
| 2015/0202854 A1 | 7/2015 | Tsuchiya et al. | |
| 2015/0232366 A1 | 8/2015 | Fredholm et al. | |
| 2016/0083282 A1 | 3/2016 | Jouanno et al. | |
| 2016/0137550 A1 | 5/2016 | Murata et al. | |
| 2017/0066223 A1 | 3/2017 | Notsu et al. | |
| 2017/0282503 A1 | 10/2017 | Peng et al. | |
| 2017/0305788 A1 | 10/2017 | Nikulin | |
| 2017/0311466 A1 | 10/2017 | Memering et al. | |
| 2017/0355633 A1 | 12/2017 | Cook et al. | |
| 2018/0086663 A1 | 3/2018 | Luzzato et al. | |
| 2018/0088399 A1 | 3/2018 | Fukushi et al. | |
| 2018/0125756 A1 | 5/2018 | Gerrish et al. | |
| 2018/0126704 A1 | 5/2018 | Zhang et al. | |
| 2018/0154615 A1 | 6/2018 | Dohn et al. | |
| 2018/0304825 A1 | 10/2018 | Mattelet et al. | |
| 2018/0370843 A1 | 12/2018 | Gross et al. | |
| 2019/0022979 A1 | 1/2019 | Luzzato et al. | |
| 2019/0134944 A1 | 5/2019 | Dawson-Elli | |
| 2019/0161402 A1 | 5/2019 | Harris et al. | |
| 2019/0169060 A1* | 6/2019 | Jones | C03B 32/02 |

FOREIGN PATENT DOCUMENTS

| | | |
|---|---|---|
| WO | WO2012/074983 | 6/2012 |
| WO | WO2016/065118 | 4/2016 |
| WO | WO2017/196800 | 11/2017 |

\* cited by examiner

CONTROLLED CRYSTALLIZATION OF GLASS CERAMICS FOR ELECTRONIC DEVICES

CROSS-REFERENCE TO RELATED APPLICATION(S)

This application is a nonprovisional patent application of and claims the benefit of U.S. Provisional Patent Application No. 62/593,699, filed Dec. 1, 2017 and titled "Controlled Crystallization of Glass Ceramics for Electronic Devices," the disclosure of which is hereby incorporated herein by reference in its entirety.

FIELD

The described embodiments relate generally to methods for forming a shaped glass ceramic for an electronic device. More particularly, the present embodiments relate to controlling crystallization of ceramic particles to impart desired chemical and physical characteristics to a shaped glass ceramic.

BACKGROUND

Heating a glass ceramic to temperatures for shaping or machining may cause overgrowth of the ceramic crystals. Overgrowth may adversely impact physical and chemical characteristics of the glass ceramic, thereby potentially limiting its application in consumer products. For example, material hardness, modulus, density, optical properties, chemical resistivity, viscosity, and so on may be influenced by thermal history, which may be altered by thermal energy used during a shaping or machining operation.

SUMMARY

Embodiments of the present invention are directed to controlled crystallization of a glass ceramic.

In a first aspect, disclosed herein is a method for forming a shaped glass ceramic. The method includes growing a ceramic crystalline structure to a first size within a glass workpiece. The method further includes, after growing the ceramic crystalline structure to the first size, mechanically shaping the glass workpiece. The method further includes, while mechanically shaping the glass workpiece, growing the ceramic crystalline structure to a second size that is larger than the first size.

In a second aspect, disclosed herein is another method for forming a shaped glass ceramic. The method includes pressing, in a mold, a glass material at a temperature at or above a transition temperature. The method further includes, while pressing the glass material, maintaining the glass material at the temperature above the transition temperature, thereby growing a crystalline structure within the glass material. The method further includes, while pressing the glass material, cooling the glass material below the transition temperature, thereby inhibiting growth of the crystalline structure beyond a predetermined size.

In a third aspect, disclosed herein is an electronic device. The electronic device includes an enclosure. The electronic device further includes a cover glass affixed to the enclosure and having crystalline structures therein. The crystalline structures are formed within the cover glass when the cover glass is mechanically shaped. The crystalline structures enhance a resistance to impact as compared to a cover glass lacking the crystalline structures.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like elements.

Figure 1:
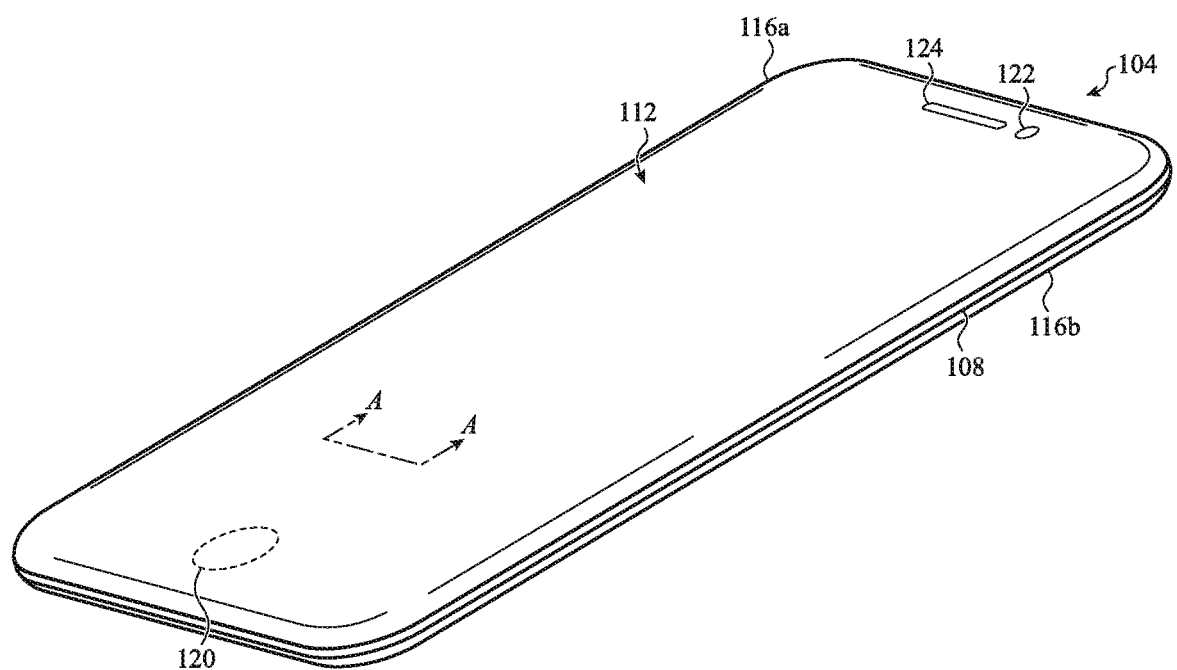
FIG. 1 depicts a sample electronic device including a shaped glass ceramic.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

The description that follows includes sample systems, methods, and apparatuses that embody various elements of the present disclosure. However, it should be understood that the described disclosure may be practiced in a variety of forms in addition to those described herein.

The present disclosure describes systems, devices, and techniques related to controlled crystallization of a shaped glass ceramic. A glass ceramic may include glass or glassy materials that may be heated in order to precipitate or nucleate ceramic particles. The glass or glassy material may be formed form a primarily amorphous material that may include other elements, particles, or other constituent components. The precipitated particles may be used to grow a ceramic crystalline structure within the glass material, thereby forming a glass ceramic. The glass ceramic may generally exhibit enhanced or modified strength, impact resistance, thermal shock resistance, optical properties, and/or other chemical or physical properties. However, thermal energy used for shaping a glass ceramic, such as by machining for implementation in a consumer electronic device, may stimulate ceramic crystal overgrowth and undesirably alter desired chemical or physical characteristics of the glass ceramic.

The methods of the present disclosure may mitigate such undesirable ceramic crystal overgrowth, thereby allowing a shaped glass ceramic to exhibit desired or predetermined chemical or physical characteristics (e.g., such as those specified or required for implementation of the shaped glass ceramic in an electronic device). Broadly, the glass ceramic may be shaped during, or in combination with (sequentially or concurrently), ceramic particle nucleation and/or ceramic crystallization growth. In this manner, ceramic particle nucleation and/or ceramic crystalline growth may be based on (or otherwise account or compensate for) shaping operations (and accompanying shaping temperatures). For example, thermal energy transferred to the glass ceramic during shaping may be used to nucleate the ceramic particles and/or grow the ceramic crystal structures. This interrelationship may allow for controlled nucleation and ceramic crystalline structure growth, including, for example, controlled crystalline structure growth to a predetermined size that imparts desired chemical or physical properties to the finished workpiece.

To facilitate the foregoing, in one embodiment, a workpiece may nucleate ceramic particles at least partially during preheating for shaping or machining of the workpiece, such as preheating to a transition temperature. The transition temperature may be substantially any temperature that allows for deformation or shaping of the workpiece without inducing brittle failure or other undesirable stresses in the workpiece. Ceramic crystal growth may also initiate or continue, depending on the chemical composition or mixture of the glass, during (and/or after) mechanically shaping the workpiece to form the shaped glass ceramic. Cooling may help limit crystalline structure growth to a specified size.

To illustrate, in one embodiment, a workpiece may nucleate ceramic particles at least partially during shaping or machining of the workpiece. For example, the workpiece (which may be substantially free of crystallite structures or grain boundaries) may be heated to (or above) a transition temperature at which the workpiece may be mechanically pressed. The nucleation temperature of the workpiece may be above the transition temperature, and therefore ceramic particles may precipitate during shaping. Ceramic crystal growth may also occur during the shaping where the temperature increases to a crystalline growth temperature, and, by maintaining this growth temperature, the ceramic crystalline structure may continue to grow post shaping. Notwithstanding, corresponding to a desired ceramic crystalline structure density and/or size, the shaped glass ceramic may be cooled to prevent overgrowth, thereby allowing the finished workpiece to exhibit desired chemical and/or physical characteristics corresponding to its implementation in an electronic device (e.g., such as an implementation in a cover glass, device enclosure, or the like).

In other cases, a glass ceramic (pre-shaping) may be formed having undersized ceramic particles and/or ceramic crystalline structures. Ceramic crystalline structures may then be grown to an appropriate size (corresponding to the desired chemical or physical characteristic) during a shaping operation. For example, a size or density of the undersized particles and/or crystalline structures may be based on the thermal energy anticipated during a subsequent shaping operation. In this manner, as the undersized glass ceramic is heated to above a transition temperature (for shaping), the resultant thermal energy may be used to produce, or continue growing, ceramic crystalline structures to the desired size or density.

It will be appreciated that, in any of the embodiments described herein, the shaped glass ceramic may be used with, or implemented within, an electronic device, such as a mobile phone, tablet, notebook, or the like, described in greater detail below. As such, the shaped glass ceramic may be a contoured, angled, and/or an at least partially curved structure that defines a functional component of the electronic device, including a cover glass, enclosure or portion of an enclosure, back plate, lens, or the like. Such electronic device component may require or benefit from exhibiting a certain material hardness, modulus, density, optical properties, chemical resistivity, viscosity, and so on, and, thus, the shaped glass ceramic of the present disclosure may be configured to exhibit these and other parameters by controlling the crystallization of ceramic structures within the shaped finished workpiece.

Reference will now be made to the accompanying drawings, which assist in illustrating various features of the present disclosure. The following description is presented for purposes of illustration and description. Furthermore, the description is not intended to limit the inventive aspects to the forms disclosed herein. Consequently, variations and modifications commensurate with the following teachings, and skill and knowledge of the relevant art, are within the scope of the present inventive aspects.

FIG. 1 depicts an example electronic device 104 having a shaped glass ceramic, such as the shaped glass ceramics generally discussed above and described in more detail below. The shaped glass ceramic may include ceramic crystalline structures grown within a glass material and may form substantially any appropriate component of the electronic device 104, including a cover glass, an electronic device enclosure or portion of an enclosure, a back plate, lens, or the like. Controlled crystallization of the ceramic crystalline structures during or in combination with shaping (machining, pressing, or the like) of the component may impart desired physical or chemical characteristics that facilitate use with the electronic device 104.

As shown, the electronic device 104 (or "device 104") is a smart phone, though it can be any suitable electronic device having a shaped glass ceramic. Some example electronic devices may include desktop computers, notebook computers, other smart phones or communication devices, tablets, portable media players, or the like. Other example electronic devices may include wearable devices (including watches, gloves, rings, or the like), health monitoring devices (including pedometers, heart rate monitors, or the like), and other electronic devices, including digital cameras, printers, scanners, security systems or devices. It will be appreciated, however, that while the shaped glass ceramic is shown as a component of the electronic device 104, the shaped glass ceramic of the present disclosure may be or define a variety of other components, including components of a substantially mechanical (non-electrically actuated or controlled) system. For example, the shaped glass ceramic may be a component of a window, building panel or wall, dashboard, cooking or laboratory implements, and/or other appropriate structures. As such, the discussion of any electronic device and shaped glass ceramic, such as the electronic device 104 and the shaped glass ceramic implemented therein, is meant as illustrative only.

For purposes of illustration, the electronic device 104 is depicted as having an enclosure 108, a display region 112, a front cover glass 116a, a back cover glass 116b, one or more input/output members 120, a camera 122, and a speaker 124. It should be noted that the electronic device 104 may also include various other components, such as one or more ports (e.g., charging ports, data transfer ports, or the like), additional input/output buttons, and so on. The display region 112 may be configured to depict a visual output of the electronic device 104, such as a symbol, glyph, graphic, animation, or the like, that is responsive to received input, such as at the front cover glass 116a, the back cover glass 116b, the input/output member 120, and/or other button or surface.

In an embodiment, the enclosure 108, the front cover glass 116a, the back cover glass 116b, and/or other component of the electronic device 104 may be formed from, or include, a shaped glass ceramic. The shaped glass ceramic may be a light-transmissive member. As used here, "light-transmissive" may generally refer to a material or layer that allows the passage of light and does not require that the material or layer be transparent, clear, or otherwise free from features that scatter or absorb some amount of light. In this regard, the shaped glass ceramic may allow light to pass without being scattered, or otherwise allow light or images to pass substantially undistorted. This may allow the shaped glass ceramic to be used as a protective cover for a camera lens, a lens, and/or other component of an optical system. The term "light-transmissive" may also encompass translucent members or embodiments where light is partially scattered or diffused.

The front cover glass 116a, the back cover glass 116b, and/or other glass ceramic or enclosure components of the electronic device 104 may be used to define a touch and/or force sensitive surface that may be used to manipulate visual outputs at the display region 112. This may be facilitated by the light-transmissive properties of the shaped glass ceramic, as described herein. In the example embodiment of FIG. 1, the front cover glass 116a is shown as defining at least a portion of an external surface of the electronic device 104. Display elements within the electronic device 104 may propagate through a thickness of the front cover glass 116a and produce the visual outputs of the display region 112. One or more sensors below the front cover glass 116a may detect input along the external surface and, in response to the detection, the visual outputs may change. While FIG. 1 shows the front cover glass 116a as defining the display region 112, it will be appreciated that the back cover glass 116b may also define a display region, and be formed from a light-transmissive shaped glass ceramic.

The shaped glass ceramic, such as that used to form the front cover glass 116a and the back cover glass 116b, are shown in FIG. 1 as have shaped or contoured edges, which may be formed according to one or more of the techniques described herein. In other embodiments, other components of the electronic device 104 may also be formed from, or include, a shaped glass ceramic, such as a camera lens (not shown in FIG. 1). The shaped glass ceramic may exhibit enhanced or modified strength, impact resistance, thermal shock resistance, optical properties, and/or other chemical or physical properties. This may be tailored to the specifications of a given component of the electronic device 104 by controlling a size and/or density of a ceramic crystalline structure grown therein, as described in greater below. For example, shaping the shaped glass ceramic to a specified geometry or contour may occur during, or in combination with, ceramic nucleation or crystalline growth to impart the desired physical or chemical characteristics to the shaped glass ceramic. This may also allow the shaped glass ceramic to be used to form a wide variety of components of the electronic device 104, including components having contoured, angled, or at least partially curved edges, while retaining the desired characteristics.

Figure 2:
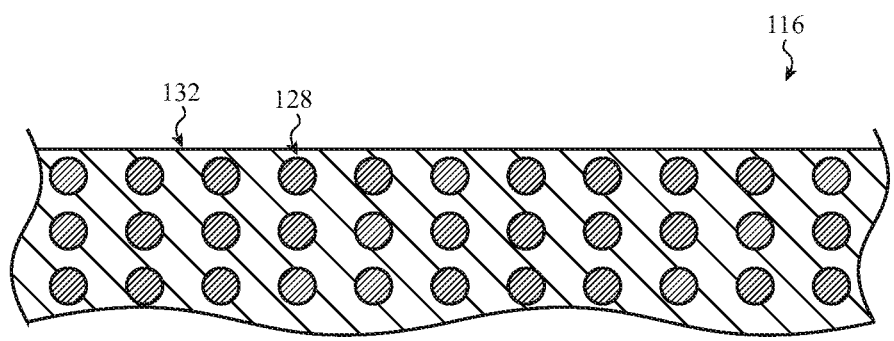
FIG. 2 depicts a cross-sectional view of the sample electronic device of FIG. 1, taken along A-A of FIG. 1.

FIG. 2 is a cross-sectional view of the cover glass 116 of FIG. 1, taken along line A-A of FIG. 1. As described above, the front cover glass 116a may be formed from, or include, a shaped glass ceramic. While the embodiment of FIG. 2 is described with respect to the front cover glass 116a, it will be appreciated that the back cover glass 116b may also be formed from, or include, a shaped glass ceramic substantially analogous to that of the front cover glass 116a as described herein with respect to FIG. 2.

Broadly, the front cover glass 116a may include ceramic crystalline structures 128 within or surrounded by a glass material 132. The glass material 132 may be a substantially non-crystalline amorphous solid. Sample compositions of the glass material 132 include soda lime, boro-silicate (and variations thereof), high silica content (96% or greater), zinc titanium, or the like. Absent the ceramic crystalline structures 128, the glass material 132 may be substantially free of grain boundaries or crystallite structures. As explained in greater detail below with respect to FIG. 3, the glass material 132 may be heated to nucleate and subsequently grow the ceramic crystalline structures 128 shown in FIG. 2.

The ceramic crystalline structures 128 may be, or define, a network or grain boundaries within the glass material 132. For example, the ceramic crystalline structure 128 may include a series of substantially uniform crystals grown from precipitated ceramic particles and form patterned or structured regions within the glass material 132. Sample compositions include one or more of lithium, aluminum, and silicon oxides; magnesium, aluminum, and silicon oxides; or zinc, aluminum, and silicon oxides; however, this is a non-exhaustive listing. The presence of the ceramic crystalline structures 128 may alter the chemical and/or physical characteristics of the glass material 132, including strength, impact resistance, thermal shock resistance, optical properties, and so on. The foregoing characteristic may be tuned according to a size and/or density of the ceramic crystalline structures 128 within the glass material 132.

For example, the front cover glass 116a may exhibit an increased strength, impact resistance, thermal shock resistance, optical properties, and so on, when the size and/or density of the ceramic crystalline structures 128 reaches a threshold. Growth of the ceramic crystalline structures 128 beyond this threshold may be undesirable, and, thus, thermal energy may be controlled in order to achieve the target material characteristics exhibited at the threshold. As described herein, mechanical shaping (e.g., pressing) may involve heating the glass material to a temperature that induces growth of the ceramic crystalline structures 128. As such, a rate of thermal energy transfer to the glass material 132 may be controlled during the shaping in order to grow the ceramic crystalline structures 128 to the appropriate size and/or density.

The front cover glass 116a may be a shaped component of the electronic device 104. For example, the front cover glass 116a may include one or more non-linear edges, contoured portions, chamfers, or the like. Broadly, shaping front cover glass 116a, or any workpiece, involves heating a base material (e.g., glass material, glass ceramic, and so on) to (or above) a transition temperature (or other appropriate temperature). The transition temperature may be any temperature that allows for deformation or shaping without inducing brittle failure or other undesirable stresses in the shaped component. Sample temperatures include greater than 600° C., 700° C., 800° C., 1000° C., 1500° C. or greater depending on a composition or mixture of the solid. In other cases, the transition temperature may be less than 600° C.

The transition temperature may be similar to temperatures used for ceramic nucleation and growth, and thus may transfer thermal energy to the solid that encourages such nucleation and growth. Rather than be overgrown by thermal energy during shaping, the ceramic crystalline structures 128 shown in FIG. 2 exhibit a desired size and density that accounts or compensates for this thermal energy. For example, the thermal energy used for shaping may be used to nucleate ceramic particles and/or grow crystalline structures to the desired size and density, such as that corresponding to desired chemical and/or physical properties for the front cover glass 116a. Accordingly, the front cover glass 116a may exhibit the desired glass ceramic characteristics despite having been shaped for implementation within an electronic device (e.g., electronic device 104 of FIG. 1).

Figure 3:
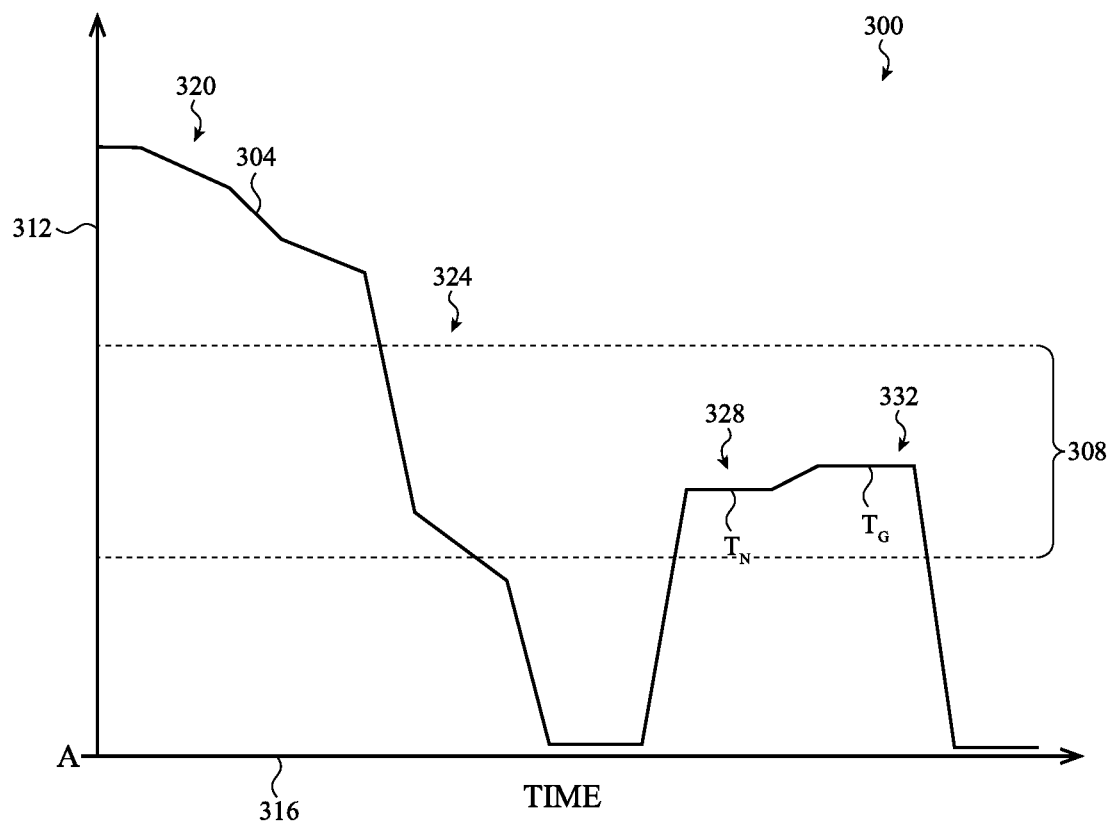
FIG. 3 depicts a temperature-time curve for forming a glass ceramic.

FIG. 3 depicts a temperature-time diagram 300. The temperature-time diagram 300 depicts a sample thermal history of a glass ceramic, such as the glass ceramics described above with respect to FIGS. 1 and 2. In particular, temperature-time diagram 300 depicts a curve 304 that represents a temperature of a workpiece as it is processed from a glass material to a glass ceramic. The diagram 300 also depicts a transition region 308. The transition region 308 corresponds to a range of possible transition temperatures (or other appropriate temperatures) that allow for shaping or machining, which may vary based on a material composition, for example, of the workpiece. As shown in FIG. 3, the transition region 308 is similar to or overlapping multiple segments of the curve 304, such as those associated with ceramic nucleation and/or crystalline growth, as described below. Accordingly, the workpiece may be shaped (including heated to or above the transition region 308) during or in combination with (sequentially or concurrently) ceramic particle nucleation and/or crystallization growth. This may allow the ceramic crystalline structures to exhibit a desired size and/or density (corresponding to specified chemical or physical characteristics of the finished workpiece) despite being shaped for implementation within an electronic device.

The diagram 300 includes a temperature axis 312 and a time axis 316. The temperature axis 312 generally represents a temperature that a workpiece may be subjected to or otherwise experienced while undergoing a processing step for forming the workpiece into a glass ceramic. An internal temperature of the workpiece may thus track or substantially coincide with a temperature value on the temperature axis 312 according to the curve 304 as the workpiece is processed. As shown in FIG. 3, a temperature value A depicted on the temperature axis 312 may represent an ambient temperature, and thus increasing values along the temperature axis 312 may indicate heating above the ambient temperature. The time axis 316 generally represents processing time or a duration of particular processing steps while processing the workpiece into the glass ceramic. In this regard, as the curve 304 continues along increasing values of the time axis 316, it may reveal the thermal history of the workpiece during the processing. For example, the curve 304 may show the duration of the workpiece at various processing steps, such as melting, solidification, cooling, nucleation, crystallization, and so on (described below), which may be indicative of the resulting chemical and/or physical characteristics of the glass ceramic workpiece. It will be appreciated, however, that the curve 304 is shown for purposes of illustration generally, and that the specific temperature and time values may vary based on a number of factors, including the material composition of the glass ceramic, the desired chemical and/or physical characteristics of the shaped glass ceramic, nucleation agent utilization, among other considerations.

As shown in FIG. 3, the diagram 300 depicts a first segment 320 of the curve 304. The first segment 320 may generally correspond to a melting operation in which consistent elements (such as oxides and carbonates) are melted. The melt may be a substantially uniform melt that is amorphous, molten, or otherwise sufficiently viscous. The melting may break down or rearrange the structure of the constituent elements (provided typically as a solid prior to melting) in order to create the uniform melt. The melt may be used, as described below, to form the base glass material that is subsequently used to form the shaped glass ceramic of the present disclosure.

The diagram 300 also depicts a second segment 324 of the curve 304. The second segment 324 may generally correspond to a solidification and cooling operation. In the solidification and cooling operation, the melt associated with the first segment 320 may undergo one or more processing steps to form a glass material or otherwise non-crystalline amorphous solid. The melt may be solidified as a glass material by cooling the melt. Possible methods include fusion drawn, floated, slab drawn, rolled, or other suitable techniques. Depending on the thermal conditions, the melt may be solidified substantially free of ceramic precipitates; however, it is possible that some precipitates may form. As shown in the second segment 324, the workpiece may be cooled to at or near ambient temperature A (or at least below the transition region 308). This may allow for inspection of the glass material. It may also allow the glass material to be manufactured separately from the manufacture of the shaped glass ceramic, described below. However, it may not be necessary for the workpiece to be cooled to below the transition region 308. For example, once substantially solidified, the non-crystalline amorphous material may be further processed (including reheated) to nucleate and grow ceramic particles within the workpiece.

The diagram 300 also depicts a third segment 328 of the curve 304. The third segment 328 may generally correspond to a nucleation operation in which ceramic particles are precipitated from the non-crystalline amorphous solid associated with the second segment 324. Specifically, when the glass material is heated, thermal energy imparted to the glass material may stimulate ceramic particles to precipitate (separate) from the base material. For example, the thermal energy may cause atoms to converge within the glass material and form a nucleus (ceramic particle) from which a ceramic crystalline structure may be grown. In some cases, a nucleation agent may be used (added to the glass material during heating) to facilitate precipitation. Sample nucleation agents include $TiO_2$, $ZrO_2$, $P_2O_5$; although other agents are possible. Nucleation may generally initiate at or above a nucleation temperature $T_N$ shown in the diagram 300.

The diagram 300 also depicts a fourth segment 332 of the curve 304. The fourth segment 332 may generally correspond to a growth operation in which ceramic crystalline structures are grown from the precipitated ceramic particles associated with the third segment 328. The ceramic crystalline structure may be grown by heating the precipitated ceramic particles to (or above) a growth temperature $T_G$ shown in the diagram 300. As shown, $T_G$ may generally be greater than $T_N$. The increased thermal energy imparted to the workpiece at the fourth segment 332 may facilitate growth of the ceramic crystalline structures along a path or pattern to define grain boundaries within the workpiece. Generally, the ceramic crystalline structure will continue to grow while the temperature is maintained at or above $T_G$ until a threshold or maximum size and density is reached. It may be desirable, however, to produce a glass ceramic having ceramic crystalline size and density below or even substantially below any threshold value in order to impart desired chemical and/or physical characteristics to the finished workpiece. The workpiece may be cooled in order to inhibit growing of ceramic crystalline structures beyond a predetermined size.

Shaping the workpiece generally occurs within or above temperatures associated with the transition region 308. At such temperatures, the workpiece may be substantially viscous or deformable to allow for mechanical pressing, machining, cutting, stamping, or the like without inducing brittle failure in the workpiece or otherwise creating undue stresses therein. This may be a glass transition temperature, softening temperature, working temperature, and/or other appropriate temperature. As shown in FIG. 3, the transition region 308 may include or overlap the nucleation temperature $T_N$ and/or the growth temperature $T_G$. As such, shaping the workpiece may occur at or near temperatures that stimulate ceramic nucleation and/or crystallization within the workpiece. Accordingly, as described in the embodiments of FIGS. 4, 6, and 8, workpiece shaping may occur during, or in combination with (concurrently or sequentially), nucleation and/or growth in order to control crystal size and/or density within the resulting workpiece, thereby producing a workpiece with desired chemical and/or physical properties suitable for use with a consumer electronic device.

Multiple techniques may be used to form a shaped glass ceramic having desired chemical and/or physical properties. In one embodiment, described with respect to FIGS. 4-5E, a non-crystalline amorphous solid may nucleate ceramic particles at least partially during preheating for shaping or machining of a glass material. In other embodiments, described with respect to FIGS. 6-7E, a non-crystalline amorphous solid may nucleate at least partially during shaping or machining, such as while pressing the solid within a mold. In another embodiment described with respect to FIG. 8-10B, a glass ceramic having undersized ceramic crystal may be grown to a desired size during a subsequent shaping process. It will be appreciated, however, that these embodiments are presented for purposes of illustration. Other embodiments and variations of the foregoing processes (including more, fewer, or different steps than those illustrated) consistent with the teaching presented herein are also envisioned and encompassed with the present disclosure.

Figure 4:
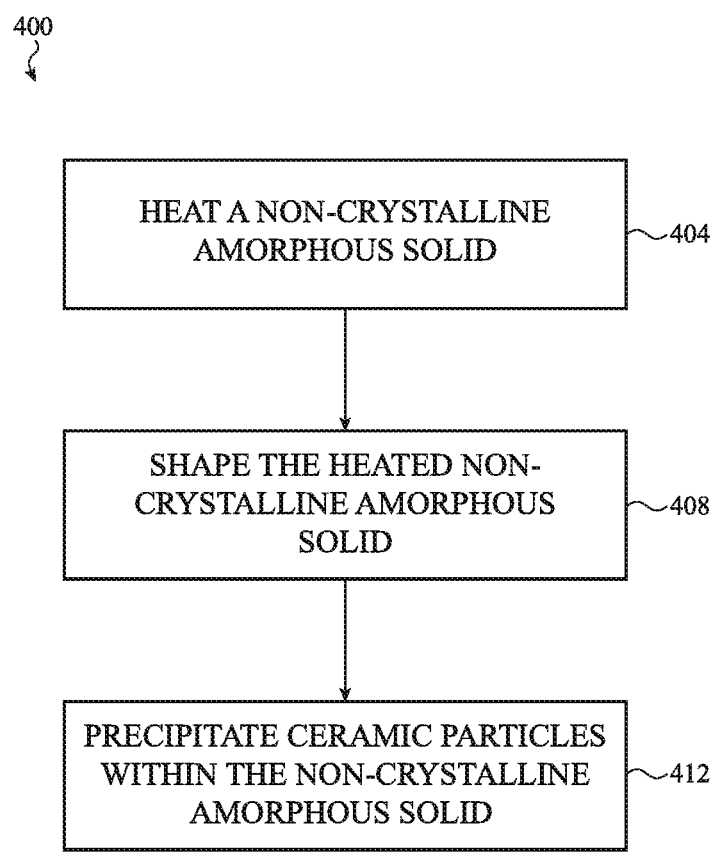
FIG. 4 depicts a flow diagram of a method of forming a shaped glass ceramic.

FIG. 4 depicts an example process for forming a shaped glass ceramic. In particular, FIG. 4 is a flow chart depicting a process 400 for forming a shaped glass ceramic. The shaped glass ceramic formed by the process 400 may have a size and/or density of ceramic crystalline structures based on desired chemical or physical characteristics of a finished workpiece corresponding to its implementation in an electronic device (e.g., cover glass, device enclosure, or the like). To facilitate the foregoing, the glass ceramic may be shaped during or in combination with (sequentially or concurrently) ceramic particle nucleation and/or ceramic crystalline growth.

At operation 404, a non-crystalline amorphous solid may be heated to a transition temperature. For example and with reference to FIG. 3, a glass material (e.g., soda lime, boro-silicate, or the like described herein) may be heated to a temperature within the transition region 308. The glass material may be initially free of ceramic particles, ceramic crystallite structures, or other crystallites; however in some cases these may be present. The glass material may be heated to within the transition region 308 in order to shape the glass material. This may be accomplished by deforming, pressing, machining, or the like in order to produce a desired contour or shape (such as that corresponding to its use in an electronic device). Accordingly, the operation 404 may correspond to a preheating of the glass material to the transition region 308. For example, the glass material may be heated along the curve 304 shown in FIG. 3 to the transition region 308 (from an ambient or near ambient temperature) during the operation 404. As described below, ceramic particles may nucleate or grow during the operation 404, for example, when the nucleation and/or growth temperature of the ceramic is less than a temperature of the transition region 308.

At operation 408, the heated non-crystalline amorphous solid of operation 404 may be shaped. As described below in greater detail with respect to FIGS. 5A-5E, the preheated glass material associated with operation 404 may be manipulated into a desired shape or contour. This may occur, for example, as the result of mechanical pressing or otherwise exerting a mechanical force on heated glass material within a mold. The heated glass material may conform to a contour of the mold to produce the desired shape. During operation 408, the glass material may be at or above temperatures associated with the transition region 308. This may allow the glass material to conform to the desired shape without producing undesirable stresses in the finished part or otherwise inducing brittle fracture as a result of the mechanical action of a press. In some cases, the mechanical force tapers after the material substantially conforms to the mold.

At operation 412, ceramic particles may be precipitated with the non-crystalline amorphous solid during at least one of operation 404 (heating) or operation 408 (shaping), thereby forming the shaped glass ceramic. Ceramic particles and/or crystalline structures may be formed within the glass material using the heat received during operation 404 (preheat) or operation 408 (shaping). This may allow the shaped glass ceramic to have ceramic crystalline structures that exhibit a desired size and/or density (corresponding to specified chemical or physical characteristics of the finished part) despite being shaped for implementation within an electronic device. For example and with reference to FIG. 3, the nucleation temperature $T_N$ and/or the growth temperature $T_G$ may be less than a temperature of the transition region 308 used for the shaping of operation 408, thereby allowing for nucleation and/or growth during the preheat. In other cases, the nucleation temperature $T_N$ may be less than the temperature for the shaping of operation 408, while the growth temperature $T_G$ may be greater, thereby allowing for nucleation during the preheat and subsequent growth during shaping. In yet other cases, both of the nucleation temperature $T_N$ and the growth temperature $T_G$ may be greater than the temperature for the shaping of operation 408 and, as such, the nucleation and shaping may occur during shaping (e.g., such as while the glass material is being pressed within a mold or otherwise receiving a mechanical force).

The process 400 may therefore be used to grow ceramic crystalline structures from the precipitated ceramic particles to an average density and/or size. This may be based on the thermal energy received and transferred to the workpiece during the preheat of operation 404 and/or the shaping of operation 408. For example, heat received during operation 404 and/or operation 408 may initiate (and sustain) growth of the ceramic crystalline structures toward the desired density and/or size. The average density and/or size of the resulting ceramic crystalline structures may impart a desired chemical characteristic to the shaped glass ceramic. Accordingly, the heat input during operation 404 and operation 408 may be used, or even controlled, to facilitate ceramic growth. The shaped glass ceramic may be actively cooled to inhibit the growth of the ceramic crystalline structure beyond a predetermined size or density.

The predetermined size and/or average density of ceramic crystalline structures of the shaped glass ceramic may correspond to desired chemical or physical properties for its implementation in an electronic device. As a non-limiting example, the shaped glass ceramic formed using the process 400 may be a cover glass for an electronic device display. The predetermined size and/or average density, for example, may be configured to reduce degradation of the cover glass over time (for example, by enhancing its impact resistance). The predetermined size and/or average density may impart chemical or physical characteristics to the cover glass that may reduce chipping, impact damage, optical glare or interference, and/or enhance corrosion resistivity, among other possibilities.

Turning next to FIGS. 5A-5E, a cross-sectional view of a workpiece is shown undergoing various processing steps. In particular, FIGS. 5A-5E depict the formation of a shaped glass ceramic generally undergoing the process 400 described above with respect to FIG. 4. It will be appreciated, however, that FIGS. 5A-5E are presented for purposes of illustration only; variations of the process 400, including different processing steps than those of FIGS. 5A-5E, are contemplated herein.

Figure 5A:
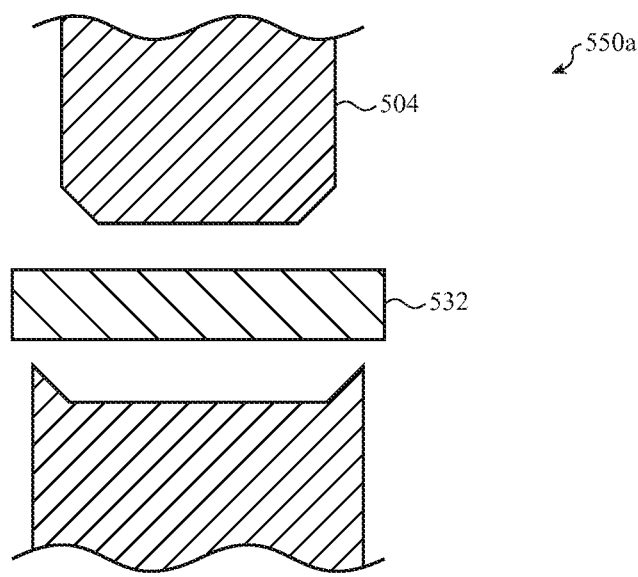
FIG. 5A depicts a cross-sectional view of a workpiece undergoing the method of forming a shaped glass ceramic of FIG. 4.

FIG. 5A depicts a processing step 550a. In the processing step 550a, a glass material 532 is shown relative to a shaping implement 504. The shaping implement 504 may be any appropriate device or machine configured to exert a mechanical force or action on a non-crystalline amorphous solid, such as the glass material 532. The glass material 532 may be substantially analogous to the glass material 132 described above with respect to FIG. 2, for example, and may generally be free of crystallites or grain boundaries. The glass material 532 may generally be at a temperature less than a transition temperature or region for the glass material 532, as well as less than a nucleation temperature or growth temperature. In some cases, the glass material 532 may be at or near an ambient temperature.

Figure 5B:
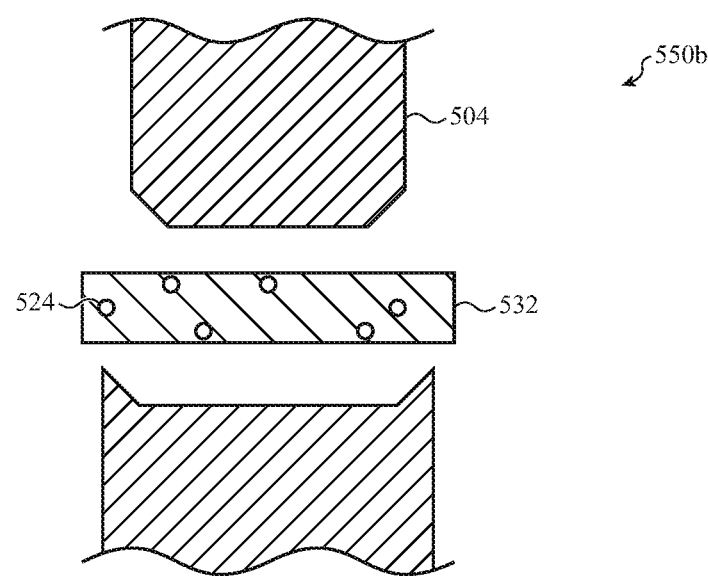
FIG. 5B depicts a cross-sectional view of a workpiece undergoing the method of forming a shaped glass ceramic of FIG. 4.

FIG. 5B depicts a processing step 550b. In the processing step 550b, the glass material 532 is heated to a transition temperature (e.g., such as a temperature within the transition region 308 of FIG. 3). This may be associated with preheating the glass material 532 to a temperature appropriate for shaping or machining. Accordingly, the processing step 550b may generally correspond to the operation 404 described with respect to FIG. 4. As shown in FIG. 5B, ceramic particles 524 may nucleate within the glass material 532 during the preheat. As such, the nucleation temperature may be less than the transition temperature and initiate in response to the temperature received during the preheat.

Figure 5C:
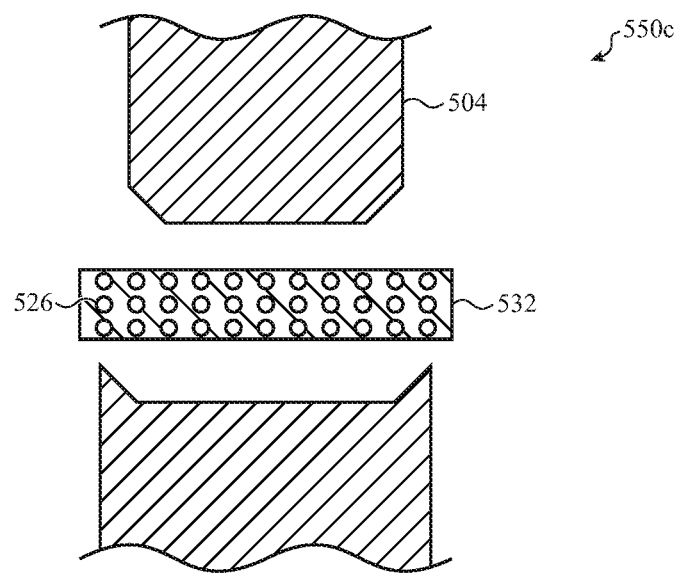
FIG. 5C depicts a cross-sectional view of a workpiece undergoing the method of forming a shaped glass ceramic of FIG. 4.

FIG. 5C depicts a processing step 550c. In the processing step 550c, the glass material 532 is further heated along a curve toward the transition temperature or region. The processing step 550c may be a continuation of the preheating initiated with the processing step 550b and may thus correspond to a higher temperature than that of the processing step 550b. As shown in FIG. 5C, ceramic crystalline structures 526 may grow within the glass material 532 during this continuation of the preheat. For example, the ceramic crystalline growth temperature may be less than the transition temperature or region, and thus the ceramic crystalline structures 526 may grow from the precipitated ceramic particles 524 prior to shaping. It will be appreciated that the ceramic crystalline structures 526 may be actively growing structures (not solidified) as the glass material 532 is maintained at or above a ceramic crystalline growth temperature, such as being maintained when the shaping ceases.

Figure 5D:
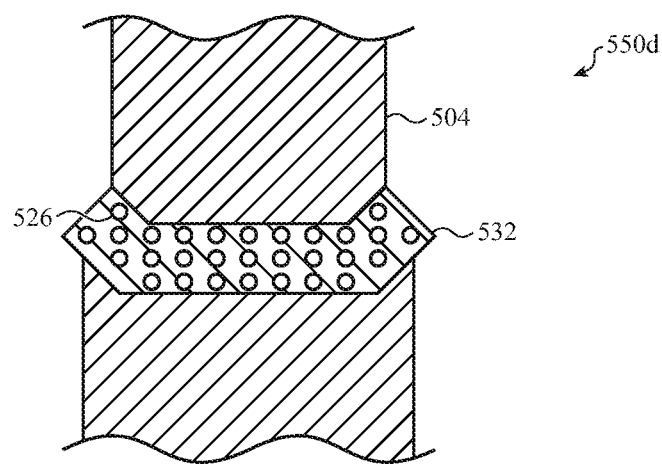
FIG. 5D depicts a cross-sectional view of a workpiece undergoing the method of forming a shaped glass ceramic of FIG. 4.

FIG. 5D depicts a processing step 550d. In the processing step 550d, the glass material 532 is pressed or otherwise manipulated by the shaping implement 504. This pressing by the shaping implement 504 may allow the glass material to be formed into a desired shape or contour, such as that appropriate for an electronic device. Accordingly, the processing step 550d may generally correspond to the operation 408 described with respect to FIG. 4. In the embodiment of FIG. 5D, the glass material 532 is shown having the ceramic crystalline structures 526, which may be actively growing structures. In this regard, FIG. 5D shows that the ceramic crystalline structures 526 may continue to grow when the glass material 532 is pressed or manipulated by the shaping implement 504. It will be appreciated, however, that the ceramic crystalline structures 526 may initially form or grow from the precipitated ceramic particles 524 during the shaping or pressing. For example, a transition temperature of the shaping may be greater than a nucleation temperature but less than a growth temperature, and therefore allows the shaping to proceed before ceramic crystalline structures grow. The material composition and temperatures may thus be calibrated, as described herein, to initiate (and sustain) ceramic crystalline growth to facilitate imparting the desired chemical or physical properties to the finished workpiece.

Figure 5E:
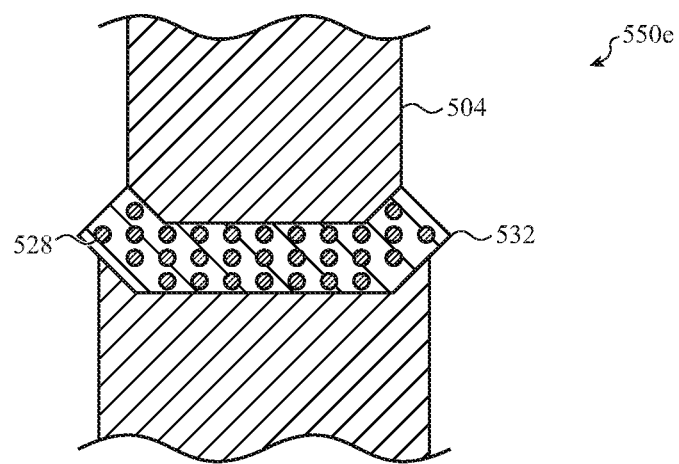
FIG. 5E depicts a cross-sectional view of a workpiece undergoing the method of forming a shaped glass ceramic of FIG. 4.

FIG. 5E depicts a processing step 550e. In the processing step 550e, the glass material 532 may be cooled to form a shaped glass ceramic or finished workpiece. As shown in FIG. 5E, when cooled, the glass material 532 may include substantially solidified ceramic crystalline structures 528. The cooling may allow for reduction (including rapid reduction, quenching) of a temperature of the glass material 532 to below a transition temperature and/or the crystalline growth temperature, as may be appropriate. Cooling may thus actively inhibit further growth of the ceramic crystalline structures beyond a predetermined size and/or average density. While FIG. 5E shows the glass material 532 cooled while engaged with the shaping implement 504, it will be appreciated that other configurations are possible, including where the glass material is substantially disengaged from the shaping implement prior to or during cooling.

Figure 6:
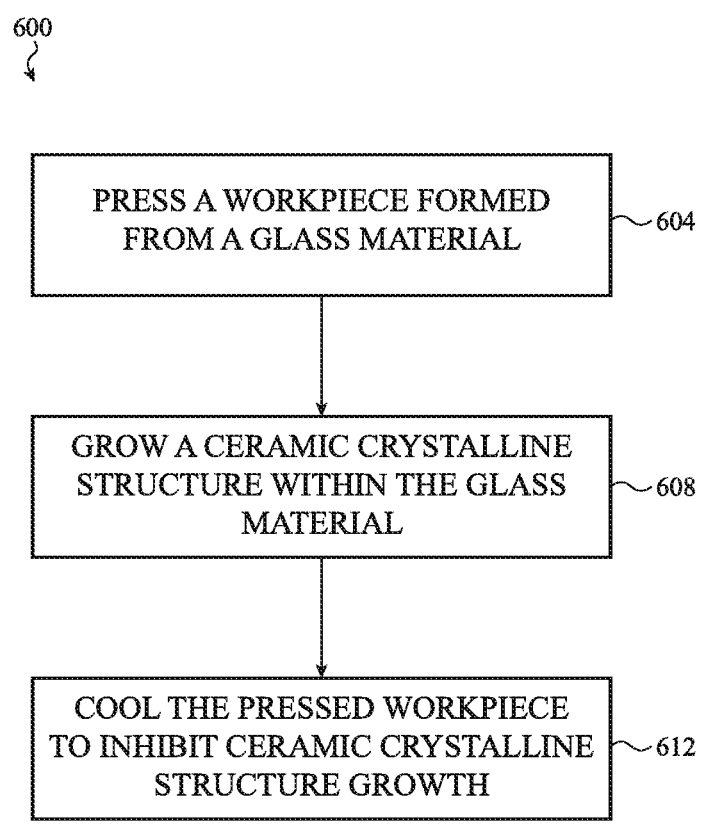
FIG. 6 depicts a flow diagram of another method of forming a shaped glass ceramic.

FIG. 6 depicts an example process for forming a shaped glass ceramic. In particular, FIG. 6 is a flow chart depicting a process 600 for forming a shaped glass ceramic. The shaped glass ceramic formed by the process 600 may have a size and/or density of ceramic crystalline structures based on desired chemical or physical characteristics of a finished workpiece corresponding to its implementation in an electronic device (e.g., cover glass, device enclosure, or the like). To facilitate the foregoing, the glass ceramic may be shaped during or in combination with (sequentially or concurrently) ceramic particle nucleation and/or ceramic crystalline growth.

At operation 604, a workpiece formed from a glass material may be pressed in a mold above a transition temperature. The workpiece may be initially substantially free of crystalline structures or grain boundaries; however, this is not required. The glass material of the workpiece may be of a composition such that a nucleation temperature $T_N$ and/or a growth temperature $T_G$ of the glass material may be greater than a transition temperature at which the material may be shaped. This may allow for particle nucleation and growth during shaping, including while the material is actively pressed within a mold.

At operation 608, a ceramic crystalline structure may be grown within glass material by maintaining the pressed workpiece of the operation 604 above a transition temperature. For example, whiling being held in the mold, ceramic particles may begin to nucleate. The workpiece may be maintained above a transition temperature (including above a growth temperature $T_G$) so that ceramic crystalline structures are also grown while the workpiece is held within the mold. In some cases, both the ceramic particle nucleation and/or the growth may occur while the mold or other shaping implement is exerting a mechanical force on the workpiece; however, this is not required. For example, the nucleation and/or growth may continue after exertion of mechanical force by the mold and/or initiated before such exertion.

At operation 612, growth of the ceramic crystalline structures may be inhibited beyond a predetermined size by cooling the pressed workpiece. After a specified time interval corresponding to desired growth of the ceramic crystalline structures within the mold or mechanical press, the temperature of the workpiece may be reduced to limit further growth of the ceramic crystalline structures. This may involve air cooling, liquid baths, or other techniques as may be appropriate for a given application. These and other techniques may allow for controlled cooling of the workpiece such that the temperature reduces a set amount during a given time interval. This may help to reduce stress concentration in the workpiece as it cools to an ambient temperature. The controlled cooling may also be initiated at a set time in order to stop or impede ceramic crystalline growth in order to form a shaped glass ceramic having the desired crystalline size or average density, for example, such as that which impacts a desired chemical or physical characteristic to the finished workpiece.

Turning next to FIGS. 7A-7E, a cross-sectional view of a workpiece is shown undergoing various processing steps. In particular, FIGS. 7A-7E depict the formation of a shaped glass ceramic generally undergoing the process 600 described above with respect to FIG. 6. It will be appreciated, however, that FIGS. 7A-7E are presented for purposes of illustration only; variations of the process 600, including different processing steps than those of FIGS. 7A-7E, are contemplated herein.

Figure 7A:
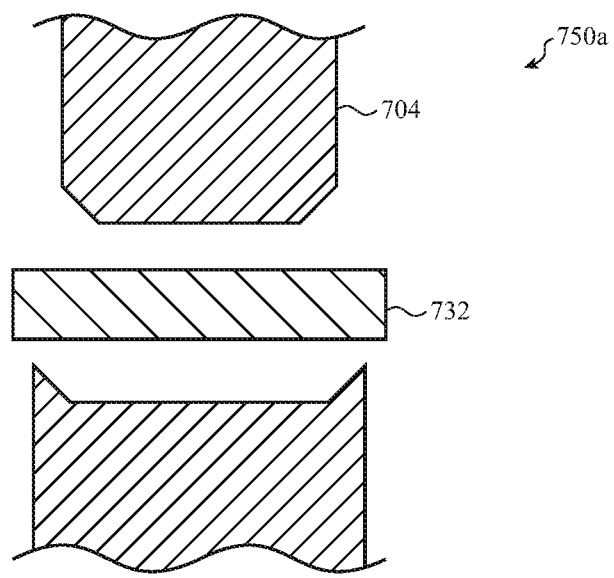
FIG. 7A depicts a cross-sectional view of a workpiece undergoing the method of forming a shaped glass ceramic of FIG. 6.

FIG. 7A depicts a processing step 750a. In the processing step 750a, a glass material 732 is shown relative to a shaping implement 704. The shaping implement 704 may be any appropriate device or machine configured to exert a mechanical force or action on a non-crystalline amorphous solid, such as the glass material 732. The glass material 732 may be substantially analogous to the glass material 132 described above with respect to FIG. 2, for example, and may generally be free of crystallites or grain boundaries. The glass material 732 may generally be at a temperature less than a transition temperature or region for the glass material 732, as well as less than a nucleation temperature or growth temperature. In some cases, the glass material 732 may be at or near an ambient temperature.

Figure 7B:
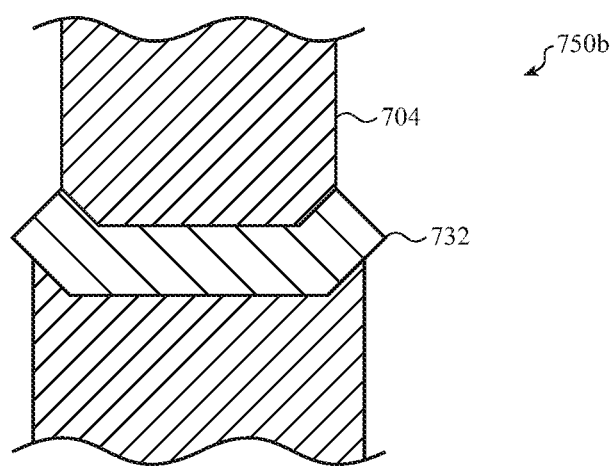
FIG. 7B depicts a cross-sectional view of a workpiece undergoing the method of forming a shaped glass ceramic of FIG. 6.

FIG. 7B depicts a processing step 750b. In the processing step 750b, the glass material 732 is heated to at or above a transition temperature or region (e.g., such as to the transition region 308 of FIG. 3) and shaped within the shaping implement 704. Accordingly, the processing step 750b may generally correspond to operation 604. For example, as shown in FIG. 7B, the glass material 732 may be pressed within a mold, such that one or more optionally contoured surfaces exerts a mechanical force on the glass material 732. The glass material 732 may be substantially viscous or deformable such that it may substantially conform to the shape of the mold when pressed and held within the shaping implement 704.

Figure 7C:
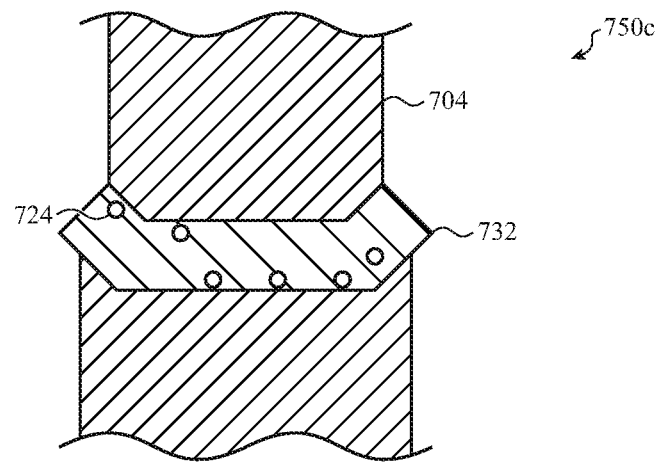
FIG. 7C depicts a cross-sectional view of a workpiece undergoing the method of forming a shaped glass ceramic of FIG. 6.

FIG. 7C depicts a processing step 750c. In the processing step 750c, the glass material 732 may be held within the shaping implement 704 while being maintained at or above the transition temperature. Accordingly, the processing step 750c may generally correspond to operation 608 described with respect to FIG. 6. In the example of FIG. 7C, a nucleation temperature of the glass material 732 may be greater than the transition temperature. In this regard, ceramic particles 724 may nucleate within the glass material 732 while the glass material 732 is held within the mold or otherwise is being shaped.

Figure 7D:
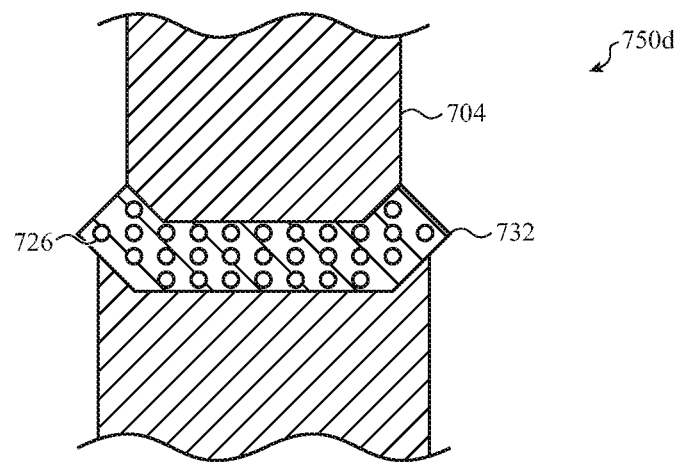
FIG. 7D depicts a cross-sectional view of a workpiece undergoing the method of forming a shaped glass ceramic of FIG. 6.

FIG. 7D depicts a processing step 750d. In the processing step 750d, the glass material 732 may be held within the shaping implement 704 while being maintained at or above the transition temperature. In the example of FIG. 7D, a ceramic crystalline growth temperature may be greater than the transition temperature. In this regard, ceramic crystalline structures 726 may grow within the glass material 732 during the shaping or pressing within the shaping implement 704. Accordingly, the processing step 750*d* may generally correspond to operation 608 described with respect to FIG. 6. It will be appreciated that the ceramic crystalline structures 726 may be actively growing structures (not solidified) as the glass material 732 is maintained at or above a ceramic crystallite growth temperature.

Figure 7E:
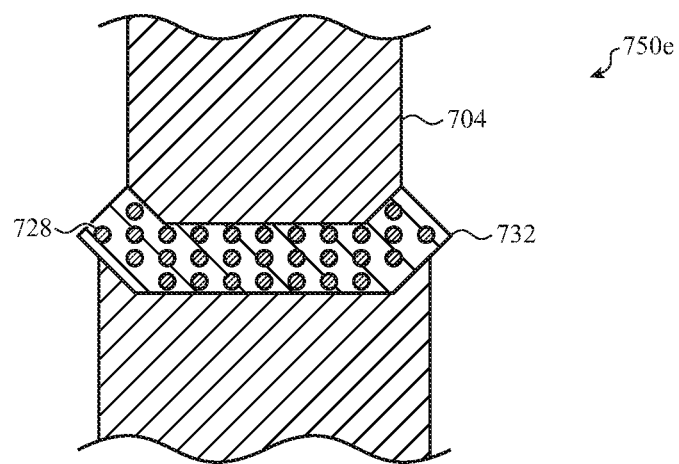
FIG. 7E depicts a cross-sectional view of a workpiece undergoing the method of forming a shaped glass ceramic of FIG. 6.

FIG. 7E depicts a processing step 750*e*. In the processing step 750*e*, the glass material 732 may be cooled to form a shaped glass ceramic or finished workpiece. Accordingly, the processing step 750*e* may generally correspond to the operation 612 described with respect to FIG. 6. As shown in FIG. 7E, when cooled, the glass material 732 may include substantially solidified ceramic crystalline structures 728. The cooling may allow for reduction (including rapid reduction) of a temperature of the glass material 732 to below a transition temperature and/or the crystalline growth temperature, as may be appropriate. Cooling may thus actively inhibit further growth of the ceramic crystalline structures 728 beyond a predetermined size and/or average density. While FIG. 7E shows the glass material 732 cooled while engaged with the shaping implement 704, it will be appreciated that other configurations are possible, including where the glass material is substantially disengaged from the shaping implement prior to or during cooling.

Figure 8:
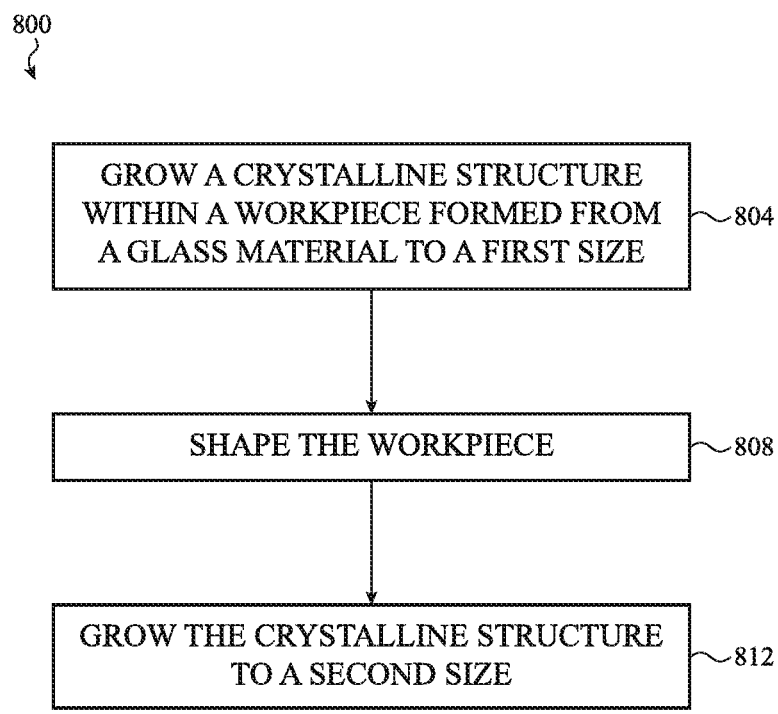
FIG. 8 depicts a flow diagram of another method of forming a shaped glass ceramic.

FIG. 8 depicts an example process for forming a shaped glass ceramic. In particular, FIG. 8 is a flow chart depicting a process 800 for forming a shaped glass ceramic. The shaped glass ceramic formed by the process 800 may have a size and/or density of ceramic crystalline structures based on desired chemical or physical characteristics of a finished workpiece corresponding to its implementation in an electronic device (e.g., cover glass, device enclosure, or the like). To facilitate the foregoing, the glass ceramic may be shaped during or in combination with (sequentially or concurrently) ceramic particle nucleation and/or ceramic crystalline growth.

At operation 804, a ceramic crystalline structure may be grown within a workpiece formed from a glass material to a first size. For example, a glass material or other non-crystalline amorphous solid may be heated to nucleate ceramic particles and subsequently grow a ceramic crystalline structure. The ceramic crystalline structure may be grown without shaping the glass material; however, in some cases, temperatures at or greater to a transition temperature of the glass material may be used to grow the crystalline structure. The ceramic crystalline structures may be grown to a first size that is less than (or undersized) a desired size of ceramic crystalline structures in the finished workpiece. As explained below, the undersized ceramic crystalline structures may be grown to a desired size and/or density during a subsequent shaping of the workpiece. This may allow for fine tuning or control of the ceramic crystalline structure size and/or density during a shaping processing in order to form a shaped glass ceramic having desired chemical or physical characteristics.

At operation 808, the workpiece of operation 804 may be shaped by exerting a mechanical force on the workpiece. As described below in greater detail with respect to FIGS. 9A-10B, the workpiece having the ceramic crystalline structure (or nucleated ceramic particles) of the first size may be manipulated into a desired shape or contour. This may occur, for example, as the result of mechanical pressing or otherwise exerting a mechanical force on the workpiece within a mold to produce a desired shape. The workpiece may be below a transition temperature of the glass material prior to shaping, including being below a nucleation and growth temperature of the ceramic. In this regard, the shaping may involve heating the workpiece to at or above a transition temperature for shaping. This may transfer thermal energy to the workpiece, which may be used to grow the ceramic crystalline structures, as described below with respect to operation 812.

At operation 812, a ceramic crystalline structure may be grown with a workpiece to a second size that is larger than the first size during operation 808 (shaping). For example, the thermal energy used to increase a temperature of the workpiece for shaping may be used to grow the ceramic crystalline structure to a second size. For example, a growth temperature for the ceramic crystalline structure may be at or greater than a transition temperature for the glass material. As such, when the workpiece is heated for shaping, the ceramic crystalline structures may continue to grow from the first size to the second size. The second size may correspond to a desired size and/or density such that the ceramic crystalline structure imparts certain predetermined chemical or physical characteristics to the finished workpiece, such as those configured to enhance resistance to impact of an electronic device cover glass or enclosure.

In some cases, the shaping of the workpiece may involve transferring a known or predicted amount of thermal energy to the workpiece. For example, to achieve a given final shape or contour, the workpiece may be heated to above a transition temperature of the glass material for a given amount of time. This thermal energy may be used to determine an anticipated change in size of the ceramic crystal structure during the shaping. Accordingly, and with reference to operation 804 described above, the ceramic crystalline structures may be grown to the first size based on the thermal energy transferred to the workpiece during shaping. The shaping (and associated thermal energy) therefore may operate to complete or continue the growth of the ceramic crystalline structure to the desired size, for example, such as that which imparts a desired chemical or physical characteristics to the finished workpiece.

Figure 9A:
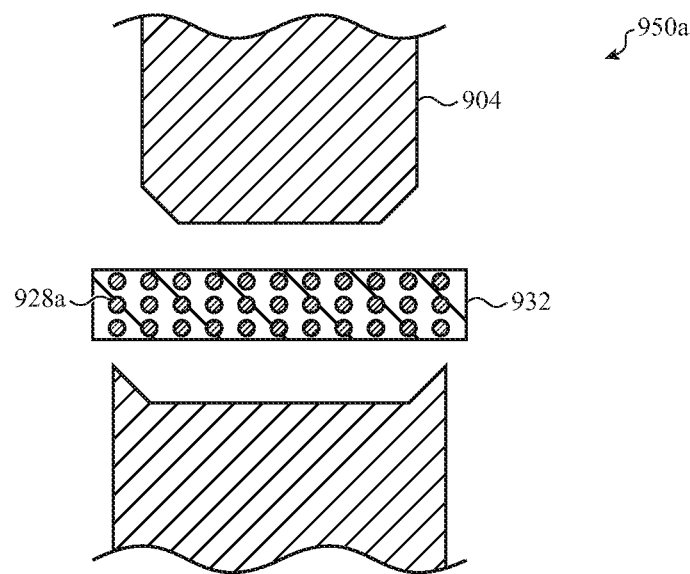
FIG. 9A depicts a cross-sectional view of a workpiece undergoing the method of forming a shaped glass ceramic of FIG. 8.
Figure 9B:
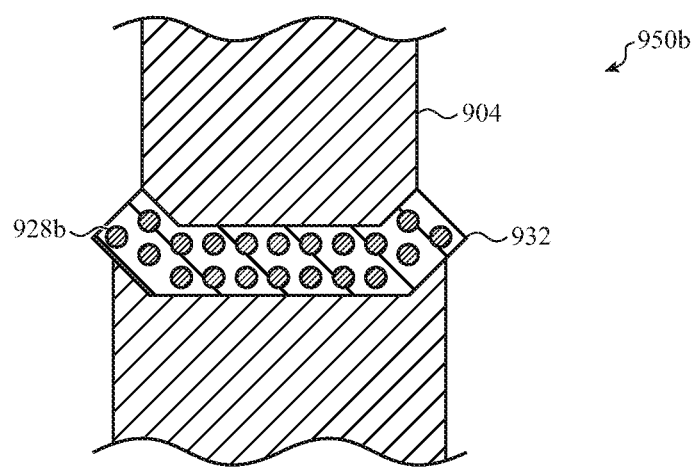
FIG. 9B depicts a cross-sectional view of a workpiece undergoing the method of forming a shaped glass ceramic of FIG. 8.

Turning next to FIGS. 9A and 9B, a cross-sectional view of a workpiece is shown undergoing various processing steps. In particular, FIGS. 9A and 9B depict the formation of a shaped glass ceramic generally undergoing the process 800 described above with respect to FIG. 8. It will be appreciated, however, that FIGS. 9A and 9B are presented for purposes of illustration only; variations of the process 800, including different processing steps than those of FIGS. 9A and 9B, are contemplated herein.

FIG. 9A depicts a processing step 950*a*. In the processing step 950*a*, a glass material 932 having ceramic crystalline structures 928*a* is shown relative to a shaping implement 904. The shaping implement 904 may be any appropriate device or machine configured to exert a mechanical force or action on a workpiece. The ceramic crystalline structure 928*a* may have a first size and/or average density. The first size and/or average density may be undersized or otherwise less than a size and/or density that may impart desired chemical or physical characteristics to the shaped glass ceramic. In this regard, as described herein, thermal energy from a subsequent shaping of the workpiece may be used to grow the undersized ceramic crystalline structures to the desired size and/or density.

FIG. 9B depicts a processing step 950*b*. In the processing step 950*b*, the glass material 932 is heated to a transition temperature (e.g., such as a temperature within the transition region 308 of FIG. 3) and shaped within the shaping implement 904. For example, as shown in FIG. 9B, the glass material 932 may be pressed within a mold, such that one or more optionally contoured surfaces exerts a mechanical force on the glass material 932. The glass material 932 may be substantially viscous or deformable such that it may substantially conform to the shape of the mold when pressed and held within the shaping implement 904. A ceramic crystalline growth temperature may be greater than or substantially coincide with temperatures used for shaping. As such, while being pressed by the shaping implement 904, the ceramic crystalline structures 928a (having a first size) may be grown and form the ceramic crystalline structure 928b that have a second larger size. The second size may correspond to a desired size and/or density that impacts certain predetermined chemical or physical characteristics to the finished workpiece, such as those configured to enhance resistance to impact of an electronic device cover glass or enclosure. Accordingly, the processing step 950b may generally correspond to operations 808 and 812 described with respect to FIG. 8.

Figure 10A:
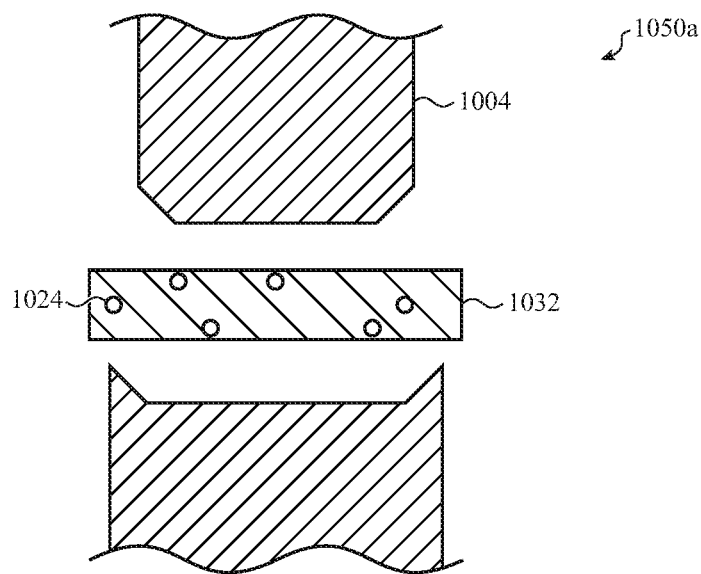
FIG. 10A depicts a cross-sectional view of a workpiece undergoing the method of forming a shaped glass ceramic of FIG. 8.
Figure 10B:
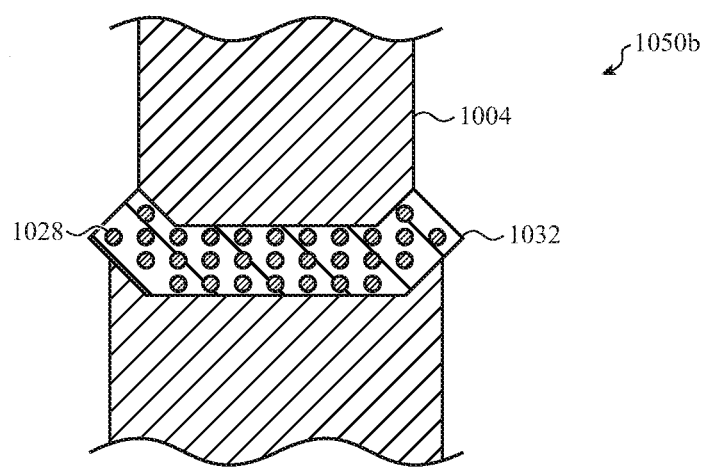
FIG. 10B depicts a cross-sectional view of a workpiece undergoing the method of forming a shaped glass ceramic of FIG. 8.

Turning next to FIGS. 10A and 10B, a cross-sectional view of a workpiece is shown undergoing various processing steps. In particular, FIGS. 10A and 10B depict the formation of a shaped glass ceramic generally undergoing the process 800 described above with respect to FIG. 8, according to another embodiment. It will be appreciated, however, that FIGS. 10A and 10B are presented for purposes of illustration only; variations of the process 800, including different processing steps than those of FIGS. 10A and 10B, are contemplated herein.

FIG. 10A depicts a processing step 1050a. In the processing step 1050a, a glass material 1032 having ceramic particles 1024 is shown relative to a shaping implement 1004. The shaping implement 1004 may be any appropriate device or machine configured to exert a mechanical force or action on a workpiece. The ceramic particles 1024 may be precipitated ceramic particles from the glass material 1032. Thermal energy from a subsequent shaping of the workpiece may be used to grow the precipitated ceramic particles into a ceramic crystalline structure having a desired size and/or density.

FIG. 10B depicts a processing step 1050b. In the processing step 1050b, the glass material 1032 is heated to a transition temperature (e.g., such as a temperature within the transition region 308 of FIG. 3) and shaped within the shaping implement 1004. For example, as shown in FIG. 10B, the glass material 1032 may be pressed within a mold, such that one or more optionally contoured surfaces exerts a mechanical force on the glass material 1032. The glass material 1032 may be substantially viscous or deformable such that it may substantially conform to the shape of the mold when pressed and held within the shaping implement 1004. A ceramic crystalline growth temperature may be greater than or substantially coincide with temperatures used for shaping. As such, while being pressed by the shaping implement 1004, the ceramic particles 1024 may be grown and form the ceramic crystalline structures 1028 that have a second larger size than the ceramic particles 1024. The second size may correspond to a desired size and/or density that impacts certain predetermined chemical or physical characteristics to the finished workpiece, such as those configured to enhance resistance to impact of an electronic device cover glass or enclosure. Accordingly, the processing step 1050b may generally correspond to operations 808 and 812 described with respect to FIG. 8.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method for forming a shaped glass ceramic, comprising:
   growing a ceramic crystalline structure to a first size, the ceramic crystalline structure grown within a glass workpiece;
   after growing the ceramic crystalline structure to the first size, mechanically shaping the glass workpiece; and
   while mechanically shaping the glass workpiece, growing the ceramic crystalline structure to a second size that is larger than the first size.

2. The method of claim 1, wherein:
   growing the ceramic crystalline structure to the second size further comprises controlling a rate of thermal energy received by the glass workpiece while mechanically shaping the glass workpiece; and
   controlling the rate of thermal energy increases an average density of the ceramic crystalline structure.

3. The method of claim 2, wherein:
   the glass workpiece includes a nucleation agent; and
   the rate of thermal energy is based on a concentration of the nucleation agent within the glass workpiece.

4. The method of claim 1, wherein the method further comprises cooling the glass workpiece after mechanically shaping the glass workpiece to limit growth of the ceramic crystalline structure to the second size.

5. The method of claim 1, wherein the glass workpiece having the ceramic crystalline structure of the second size exhibits an enhanced resistance to impact with respect to the glass workpiece having the ceramic crystalline structure of the first size.

6. The method of claim 1, wherein:
   mechanically shaping occurs at a first temperature that is above a transition temperature of the glass workpiece; and
   growing the ceramic crystalline structure to the second size occurs at a second temperature that is either above or below the transition temperature.

7. A method for forming a shaped glass ceramic cover that defines an external surface for an electronic device, the method comprising:
   growing a ceramic crystalline structure to a first size, the ceramic crystalline structure grown within a glass workpiece;

after growing the ceramic crystalline structure to the first size, mechanically shaping the glass workpiece; and while mechanically shaping the glass workpiece, growing the ceramic crystalline structure to a second size that is larger than the first size, thereby forming the shaped glass ceramic cover.

8. The method of claim 7, wherein the cover is a light-transmissive member defining a contoured exterior surface of the electronic device.

9. The method of claim 1, wherein prior to growing the ceramic crystalline structure to the first size, the glass workpiece is a substantially non-crystalline amorphous solid.

10. The method of claim 1, wherein:

the operation of growing the ceramic crystalline structure to the first size comprises growing multiple ceramic crystalline structures to the first size; and the operation of mechanically shaping the workpiece further comprises increasing an average density of the multiple ceramic crystalline structures.

11. The method of claim 8, wherein the shaped glass ceramic cover is translucent.

12. The method of claim 8, wherein the shaped glass ceramic cover is transparent.

13. The method of claim 8, wherein the ceramic crystalline structure comprises a mixture of aluminum oxide, silicon oxide, and at least one of: lithium oxide; magnesium oxide; or zinc oxide.

14. The method of claim 8, wherein the shaped glass ceramic cover comprises ceramic crystalline structures within a glass material.

15. A method for forming a shaped glass ceramic part, comprising:

providing a workpiece comprising a glass material;

growing a ceramic crystalline structure to a first size, the ceramic crystalline structure grown from the glass material of the workpiece;

after growing the ceramic crystalline structure to the first size, mechanically shaping the workpiece; and while mechanically shaping the workpiece, growing the ceramic crystalline structure to a second size that is larger than the first size, thereby forming the shaped glass ceramic part.

16. The method of claim 15, wherein, during the operation of growing the ceramic crystalline structure to the first size, the workpiece is at a first temperature above a nucleation temperature of the glass material.

17. The method of claim 15, wherein, during the operation of mechanically shaping the workpiece, the workpiece is at a second temperature below a melting temperature of the glass material.

18. The method of claim 17, wherein the second temperature is above a working temperature of the glass material.

19. The method of claim 15, wherein the glass material comprises a mixture of aluminum oxide, silicon oxide, and at least one of: lithium oxide; magnesium oxide; or zinc oxide.

20. The method of claim 15, wherein the operation of mechanically shaping the workpiece comprises conforming the workpiece to a contoured shape of a mold.

* * * * *